United States Patent
Anderson et al.

(10) Patent No.: US 9,543,167 B2
(45) Date of Patent: Jan. 10, 2017

(54) FINFET SOURCE-DRAIN MERGED BY SILICIDE-BASED MATERIAL

(71) Applicant: GLOBALFOUNDRIES INC., Grand Cayman (KY)

(72) Inventors: Brent A. Anderson, Jericho, VT (US); Nicolas Breil, Wappingers Falls, NY (US); Christian Lavoie, Pleasantville, NY (US)

(73) Assignee: GLOBALFOUNDRIES INC., Grand Cayman (KY)

(*) Notice: Subject to any disclaimer, the term of this patent is extended or adjusted under 35 U.S.C. 154(b) by 15 days.

(21) Appl. No.: 14/331,267

(22) Filed: Jul. 15, 2014

(65) Prior Publication Data
US 2016/0020208 A1  Jan. 21, 2016

(51) Int. Cl.
*H01L 21/268* (2006.01)
*H01L 21/324* (2006.01)
*H01L 29/04* (2006.01)
*H01L 29/16* (2006.01)
*H01L 29/08* (2006.01)
*H01L 29/45* (2006.01)
*H01L 21/285* (2006.01)
(Continued)

(52) U.S. Cl.
CPC .......... *H01L 21/324* (2013.01); *H01L 21/268* (2013.01); *H01L 21/28518* (2013.01); *H01L 21/28531* (2013.01); *H01L 21/321* (2013.01); *H01L 21/823425* (2013.01); *H01L 21/823431* (2013.01); *H01L 29/045* (2013.01); *H01L 29/0847* (2013.01); *H01L 29/16* (2013.01); *H01L 29/456* (2013.01)

(58) Field of Classification Search
CPC .. H01L 27/0886; H01L 29/456; H01L 29/045; H01L 29/16; H01L 29/0847; H01L 21/823431; H01L 21/823475; H01L 21/28568; H01L 21/324; H01L 21/321; H01L 21/28518
See application file for complete search history.

(56) References Cited

U.S. PATENT DOCUMENTS 7,692,254 B2   4/2010  Anderson et al.
8,264,021 B2   9/2012  Lai et al.
(Continued)

OTHER PUBLICATIONS

IBM: List of IBM Patents or Patent Applications Treated As Related (Appendix P), dated Jan. 8, 2015.
(Continued)

*Primary Examiner* — Stephen W Smoot
(74) *Attorney, Agent, or Firm* — Yuanmin Cai; Hoffman Warnick, LLC

(57) ABSTRACT

A method includes conducting a laser-based anneal treatment on a metal layer positioned above and in direct contact with a first diamond shaped epitaxial layer surrounding a first fin and a second diamond shaped epitaxial layer surrounding a second fin, the metal layer extends from the first diamond shaped epitaxial layer to the second diamond shaped epitaxial layer, the laser-based anneal treatment forms a silicide layer, a portion of the silicide layer between the first and the second diamond shaped epitaxial layers is substantially thicker than a portion of the silicide layer in contact with the first and the second diamond shaped epitaxial layers, and the silicide layer takes on a crystal orientation of the first and the second epitaxial layers.

14 Claims, 8 Drawing Sheets

(51) Int. Cl.
*H01L 21/321* (2006.01)
*H01L 21/8234* (2006.01)

(56) References Cited

U.S. PATENT DOCUMENTS

| | | | |
|---|---|---|---|
| 8,362,568 B2 | 1/2013 | Lin et al. | |
| 2002/0036320 A1 | 3/2002 | Ichimori et al. | |
| 2010/0075499 A1* | 3/2010 | Olsen | H01L 21/28052 438/682 |
| 2010/0276761 A1 | 11/2010 | Tung et al. | |
| 2011/0298058 A1* | 12/2011 | Kawasaki | H01L 29/7853 257/401 |
| 2013/0069128 A1 | 3/2013 | Okano | |
| 2013/0154005 A1 | 6/2013 | Basker et al. | |
| 2014/0167264 A1* | 6/2014 | Besser | H01L 29/4916 257/741 |
| 2015/0041918 A1 | 2/2015 | Wann et al. | |
| 2015/0214228 A1* | 7/2015 | Koh | H01L 27/0924 257/369 |
| 2015/0279840 A1* | 10/2015 | Huang | H01L 21/28518 257/384 |
| 2015/0325692 A1* | 11/2015 | Zang | H01L 21/82343 257/365 |
| 2015/0380489 A1* | 12/2015 | Chan | H01L 27/0886 257/192 |

OTHER PUBLICATIONS

U.S. Appl. No. 14/561,632, filed Dec. 5, 2014, entitled: FinFET Source-Drain Merged by Silicide-Based Material.

Smith, "Advanced Technology for Source Drain Resistance Reduction in Nanoscale FinFETs", PhD Dissertation, University of North Dallas, May 2008.

Dixit et al., "Minimization of MuGFET source/drain resistance using wrap-around NiSi-HDD contacts", Solid-State Electronics, vol. 50, pp. 1466-1471 (2006).

Murarka, "Refractory Silicides for Integrated Circuits", Journal of Vacuum Science & Technology, vol. 17, No. 4, pp. 775-792, Jul./Aug. 1980.

Bennett et al., "Enhanced n-type dopant solubility in tensile-strained Si", Thin Solid Films, vol. 517, pp. 331-333, (2008).

* cited by examiner

FINFET SOURCE-DRAIN MERGED BY SILICIDE-BASED MATERIAL

BACKGROUND

The present invention generally relates to semiconductor manufacturing and more particularly to fin field effect transistor (FinFET) devices having source-drain regions merged by a silicide-based material.

Complementary metal-oxide-semiconductor (CMOS) technology is commonly used for fabricating field effect transistors (FETs) as part of advanced integrated circuits (IC), such as CPUs, memory, storage devices, and the like. Most common among these may be metal-oxide-semiconductor field effect transistors (MOSFET). In a typical MOSFET, a gate structure may be energized to create an electric field in an underlying channel region of a substrate, by which charge carriers are allowed to travel between a source region and a drain region. As ICs continue to scale downward in size, fin field effect transistors (FinFETs), sometimes referred to as tri-gate structures, may be potential candidates for the 14 nm node technology and beyond, primarily because FinFETs may offer better performance than planar FETs at the same power budget. FinFETs are three-dimensional (3D), fully depleted MOSFET devices having a plurality of fins formed from the substrate material. The gate structure may be located over the fins substantially covering the channel region, the portion of the fins not covered by the gate structure may define the source-drain regions of the device. Such architecture may allow for a more precise control of the conducting channel by the gate structure, significantly reducing the amount of current leakage when the device is in off state.

Owing to the smaller sizes and closer proximity of contacts, parasitic resistance may be substantially increased in FinFET devices. In CMOS technology, contacts may be formed to electrically connect an active region within the device, e.g., a source-drain region or gate structure, and a metal layer. Silicides are metal-silicon compounds that are increasingly used to form contacts that may reduce electrical resistance.

SUMMARY

According to one embodiment of the present disclosure, a method may include: conducting a laser-based anneal treatment on a metal layer positioned above and in direct contact with a first diamond shaped epitaxial layer surrounding a first fin and a second diamond shaped epitaxial layer surrounding a second fin, the metal layer may extend from the first diamond shaped epitaxial layer to the second diamond shaped epitaxial layer, the laser-based anneal treatment may form a silicide layer, a portion of the silicide layer between the first and the second diamond shaped epitaxial layers may be substantially thicker than a portion of the silicide layer in contact with the first and the second diamond shaped epitaxial layers, and the silicide layer may take on a crystal orientation of the first and the second epitaxial layers.

According to another embodiment of the present disclosure, a method may include: forming a first fin and a second fin on a substrate, the first fin may be adjacent to the second fin. A gate structure may be formed over a first portion of both the first fin and the second fin, the gate structure may not cover a second portion of both the first fin and the second fin. A first epitaxial layer may be formed surrounding the second portion of the first fin and a second epitaxial layer may be formed surrounding the second portion of the second fin, a gap may exist between the first epitaxial layer and the second epitaxial layer, the first and the second epitaxial layers may include silicon. A first metal layer may be deposited above and in direct contact with a top portion of the first epitaxial layer and a top portion of the second epitaxial layer until the gap between the first and the second epitaxial layers may be closed, the first metal layer may extend from the first epitaxial layer to the second epitaxial layer, a space may remain below the first metal layer and between the first and the second epitaxial layers. A second metal layer may be deposited above and in direct contact with the first metal layer. A laser-based anneal treatment may be conducted on the first metal layer to promote a reaction between the first and the second epitaxial layers and the first metal layer to form a continuous silicide layer that may merge the first and the second epitaxial layers, a portion of the continuous silicide layer between the first and the second epitaxial layers may be substantially thicker than a portion of the continuous silicide layer in contact with the first and the second epitaxial layers, and the second metal layer may be removed from above the silicide layer.

According to another embodiment of the present disclosure, a structure may include: a first fin adjacent to a second fin on a substrate, a gate structure over a first portion of both the first fin and the second fin, the gate structure not covering a second portion of both the first fin and the second fin, a first epitaxial layer surrounding the second portion of the first fin and a second epitaxial layer surrounding the second portion of the second fin, and a continuous silicide layer above and in direct contact with the first and the second epitaxial layers, the silicide layer may extend from a top portion of the first epitaxial layer to a top portion of the second epitaxial layer such that a space may remain below the silicide layer and above an area of the substrate located between the first and the second epitaxial layers, a portion of the continuous silicide layer located between the first epitaxial layer and the second epitaxial layer may be substantially thicker than a portion of the continuous silicide layer in contact with the first and the second epitaxial layers.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
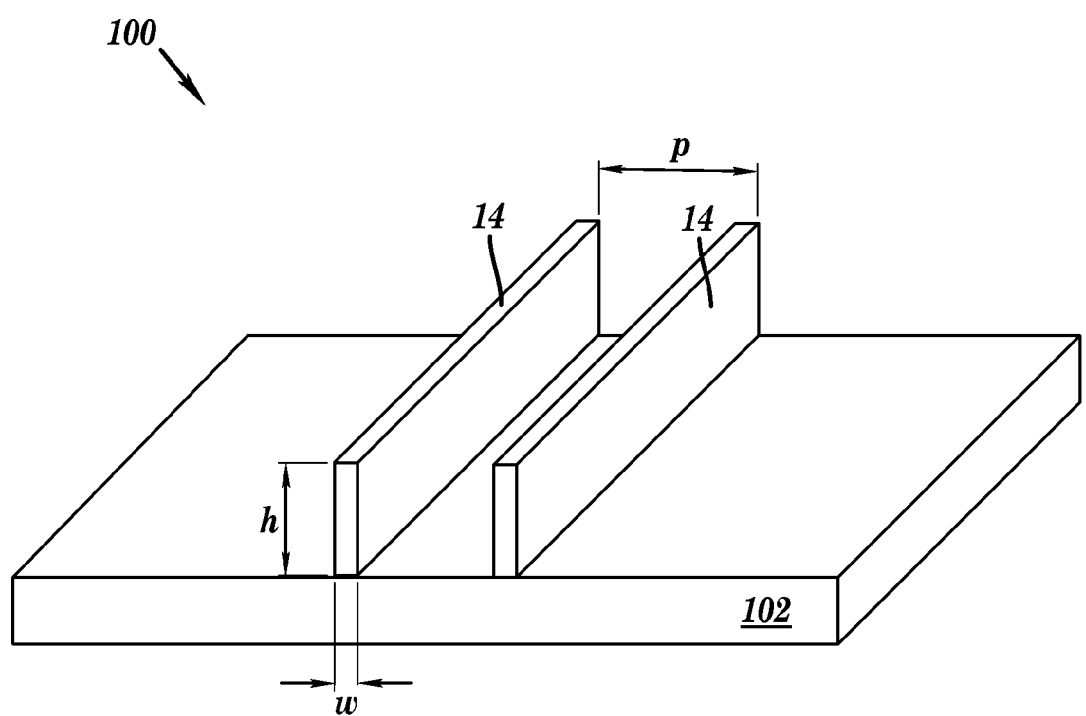
FIG. 1 is an isometric view of a semiconductor structure depicting forming a plurality of fins, according to an embodiment of the present disclosure.

Detailed embodiments of the claimed structures and methods are disclosed herein; however, it may be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art.

In the following description, numerous specific details are set forth, such as particular structures, components, materials, dimensions, processing steps, and techniques, in order to provide a thorough understanding of the present invention. However, it will be appreciated by one of ordinary skill of the art that the invention may be practiced without these specific details. In other instances, well-known structures or processing steps have not been described in detail in order to avoid obscuring the invention. It will be understood that when an element as a layer, region, or substrate is referred to as being "on" or "over" another element, it may be directly on the other element or intervening elements may also be present. In contrast, when an element is referred to as being "directly on" or "directly over" another element, there are no intervening elements present. It will also be understood that when an element is referred to as being "beneath," "below," or "under" another element, it may be directly beneath or under the other element, or intervening elements may be present. In contrast, when an element is referred to as being "directly beneath" or "directly under" another element, there are no intervening elements present.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

As the semiconductor industry moves towards manufacturing of 3D devices, including fin field effect transistors (FinFETs), reduction of source-drain parasitic resistance without sacrificing device performance and process complexity may be of special interest for current complementary metal oxide semiconductor (CMOS) technology. Typically, source-drain parasitic resistance may be reduced by epitaxially growing a doped silicon or silicon-germanium layer off the surface of a plurality of silicon fins. This epitaxial layer may be grown until forming a merged structure where silicide contacts may be subsequently deposited by metal sputtering and annealing processes. Such techniques may present several limitations to the formation of merged source-drain regions including extended deposition times and selectivity loss during the epitaxial deposition process which may ultimately lead to reduced device performance and reliability. By forming a layer of a highly conductive silicide-based material directly on at least two diamond shaped epitaxial layers surrounding at least two fins, embodiments of the present disclosure may, among other potential benefits, merge source-drain regions while providing a uniform and broader area of substantially higher conductivity for contact formation which may help reducing source-drain parasitic resistance.

The present invention generally relates to semiconductor manufacturing and more particularly to FinFET devices having source-drain regions merged by a silicide-based material. One way to merge the source-drain regions using a silicide-based material may include forming a first metal layer directly above the source-drain regions followed by a second metal layer, and performing a high temperature anneal process to form a silicide layer. One embodiment by which to merge the source-drain regions is described in detail below by referring to the accompanying drawings in FIGS. 1-13.

Referring now to FIG. 1, a semiconductor structure 100 may be formed or provided. In the depicted embodiment, the semiconductor structure 100 is a FinFET device. At this step of the manufacturing process, a plurality of fin structures 14 (hereinafter "fins") may be formed from a substrate 102 of the semiconductor structure 100. The substrate 102 may be, for example, a semiconductor-on-insulator (SOI) substrate, where a buried insulator layer separates a base substrate from a top semiconductor layer. The components of the semiconductor structure 100, including the fins 14, may then be formed in or adjacent to the top semiconductor layer. In other embodiments, the substrate 102 may be a bulk substrate which may be made from any of several known semiconductor materials such as, for example, silicon, germanium, silicon-germanium alloy, carbon-doped silicon, carbon-doped silicon-germanium alloy, and compound (e.g. III-V and II-VI) semiconductor materials. Non-limiting examples of compound semiconductor materials include gallium arsenide, indium arsenide, and indium phosphide. In this embodiment, the substrate 102 may be made of silicon.

The fins 14 may be formed by any method known in the art. In an exemplary embodiment, the fins 14 may be formed by a sidewall image transfer (SIT) technique. In embodiments in which the fins 14 may be formed from a bulk semiconductor substrate, the fins 14 may be isolated from one another by regions of a dielectric material. It should be noted that, while the embodiment depicted in FIG. 1 includes two fins 14, any number of fins may be formed from the substrate 102. In one exemplary embodiment, the fins 14 may have a height h ranging from approximately 5 nm to approximately 200 nm, a width w ranging from approximately 5 nm to approximately 50 nm and may be separated by a pitch p ranging from approximately 20 nm to 100 nm.

Figure 2:
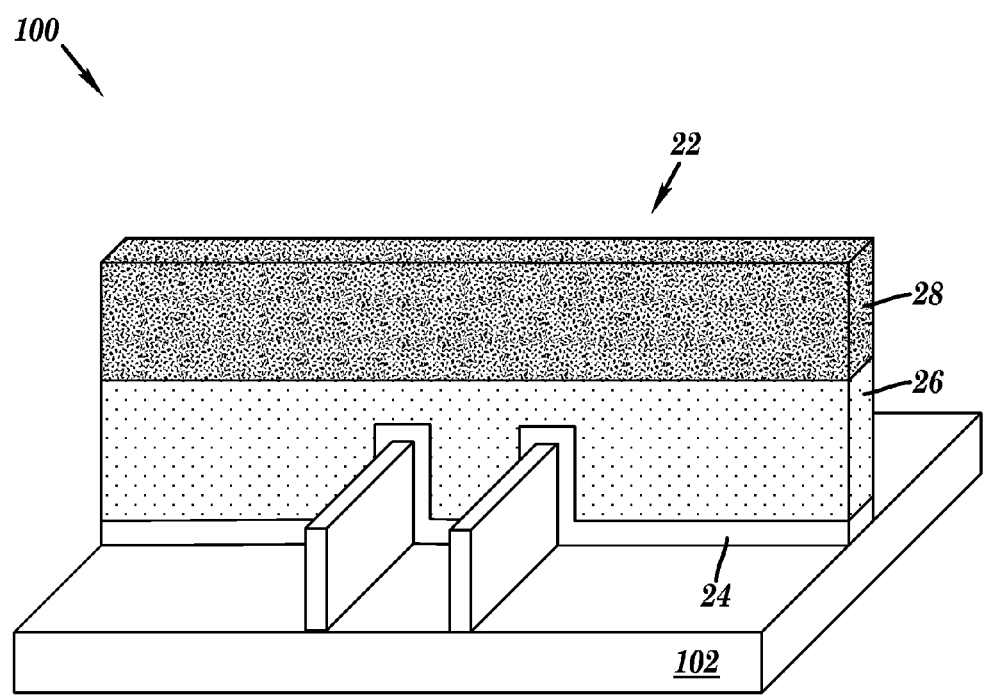
FIG. 2 is an isometric view of the semiconductor structure depicting forming a gate structure, according to an embodiment of the present disclosure.

Referring now to FIG. 2, a gate structure 22 may be formed over a portion of the fins 14 covering a channel region (not shown) of the semiconductor structure 100. It should be noted that the semiconductor structure 100 may be fabricated using either a replacement metal gate (RMG) or gate last process flow, or a gate first process flow. For illustration purposes only, without intent of limitation, the embodiment described below uses a gate first process flow.

At this point of the manufacturing process, the gate structure 22 may include a gate dielectric 24, a gate electrode 26 and a gate cap 28. The gate dielectric 24 may include any suitable insulating material such as, for example, oxide, nitride, oxynitride or silicate including metal silicates and nitrided metal silicates. In one embodiment, the gate dielectric 24 may include an oxide such as, for example, $SiO_2$, $HfO_2$, $ZrO_2$, $Al_2O_3$, $TiO_2$, $La_2O_3$, $SrTiO_3$, $LaAlO_3$, and mixtures thereof. The gate dielectric 24 may be formed by any suitable deposition technique known in the art, including chemical vapor deposition (CVD), plasma-assisted CVD, atomic layer deposition (ALD), evaporation, reactive sputtering, chemical solution deposition or other like deposition processes. The physical thickness of the gate dielectric 24 may vary, but typically may have a thickness ranging from about 0.5 nm to about 10 nm. More preferably the gate dielectric 24 may have a thickness ranging from about 0.5 nm to about 3 nm.

The gate electrode 26 may be formed above the gate dielectric 24. The gate electrode 26 may include, for example, Zr, W, Ta, Hf, Ti, Al, Ru, Pa, metal oxide, metal carbide, metal nitride, transition metal aluminides (e.g. Ti3Al, ZrAl), TaC, TiC, TaMgC, and any combination of those materials. In one embodiment, the gate electrode 26 may include tungsten (W). The gate electrode 26 may be deposited by any suitable technique known in the art, for example by ALD, CVD, physical vapor deposition (PVD), molecular beam deposition (MBD), pulsed laser deposition (PLD), or liquid source misted chemical deposition (LSMCD).

The gate cap 28 may be formed on top of the gate electrode 26 using any suitable deposition technique known in the art. The gate cap 28 may include, for example, silicon oxide, silicon nitride, silicon oxynitride, boron nitride, or any suitable combination of those materials.

Figure 3:
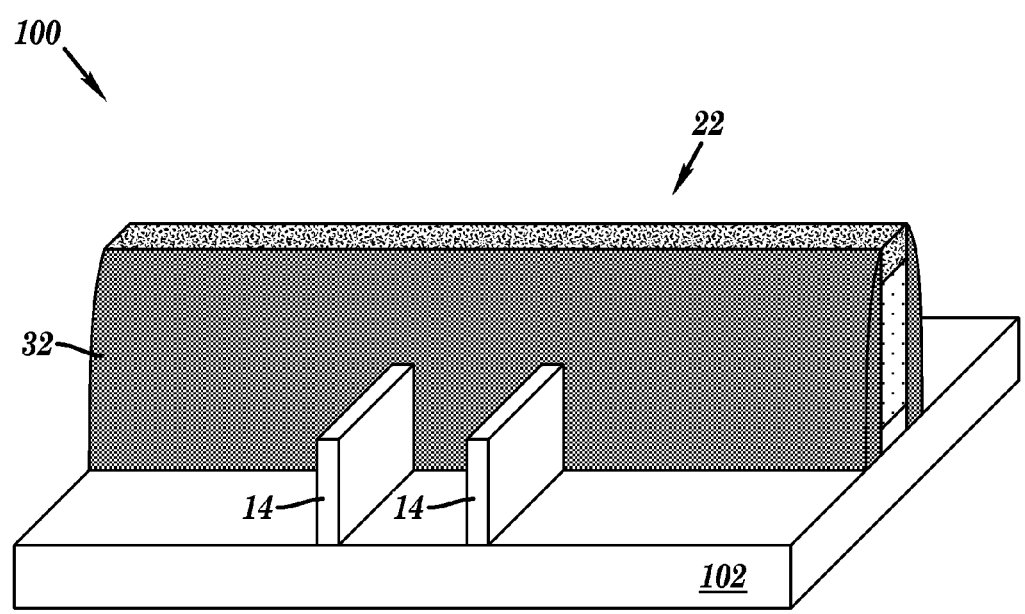
FIG. 3 is an isometric view of the semiconductor structure depicting forming gate spacers, according to an embodiment of the present disclosure.

Referring now to FIG. 3, gate spacers 32 may be formed on opposite sidewalls of the gate structure 22. The gate spacers 32 may be made from an insulator material such as an oxide, nitride, oxynitride, silicon carbon oxynitride, silicon boron oxynitride, low-k dielectric, or any combination thereof. In one embodiment, the gate spacers 32 may be made from a nitride and may be formed by conventional deposition and etching techniques. In various embodiments, the gate spacers 32 may include one or more layers. It should be understood that while the gate spacers 32 are herein described in the plural, the gate spacers 32 may consist of a single spacer surrounding the gate structure 22.

Figure 4:
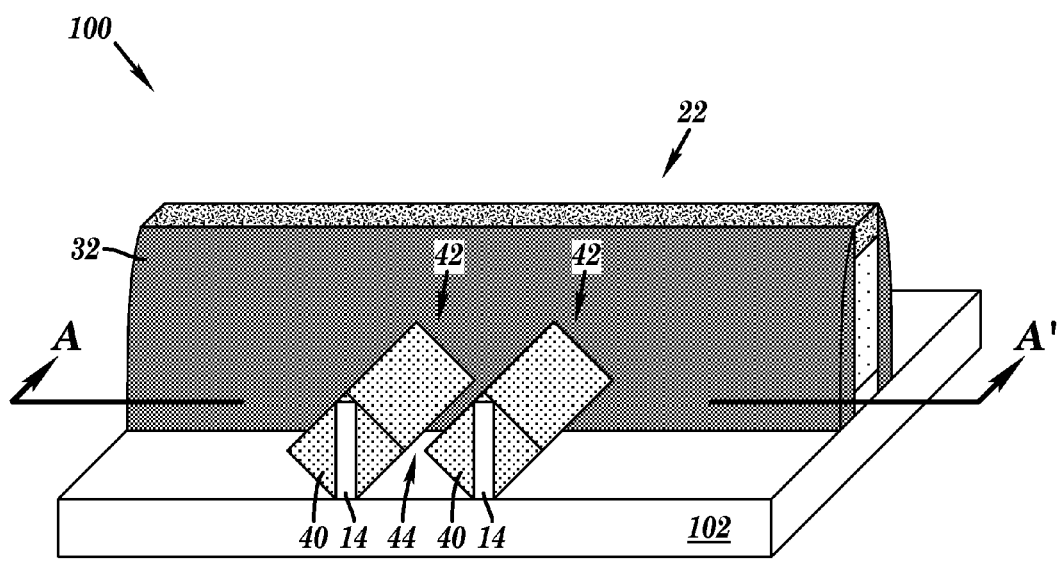
FIG. 4 is an isometric view of the semiconductor structure depicting forming an epitaxial layer, according to an embodiment of the present disclosure.
Figure 5:
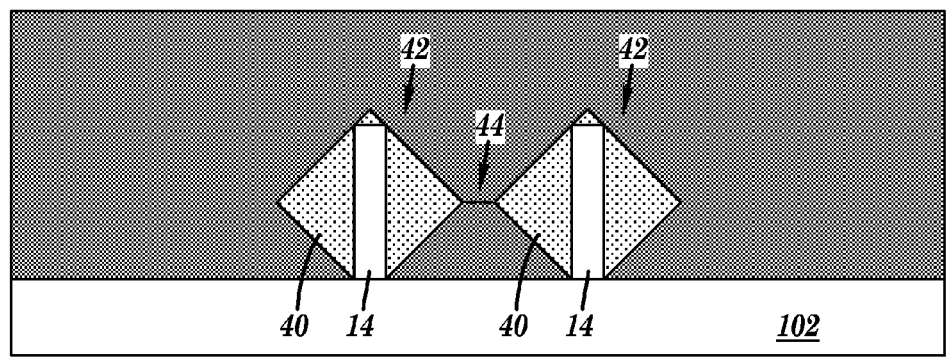
FIG. 5 is a cross-sectional view of the semiconductor structure, according to FIG. 4.

Referring now to FIGS. 4-5, an epitaxial layer 40 may be formed on exposed portions of the fins 14. In this embodiment, FIG. 5 is a cross-sectional view of FIG. 4 taken along line A-A'. The exposed portions of the fins 14 may consist of regions of the fins 14 not covered by the gate structure 22 as illustrated in FIG. 3. The epitaxial layer 40 may include a monocrystalline material epitaxially grown on the fins 14. Growth of the epitaxial layer 40 may include forming the epitaxial layer 40 off a surface of the fins 14 such that the epitaxial layer 40 surrounding one of the fins 14 does not contact the epitaxial layer 40 surrounding an adjacent fin 14 thereby forming unmerged source-drain regions 42. The unmerged source-drain regions 42 may be separated by a gap 44. In the depicted embodiment, the diamond shape observed in the unmerged source-drain regions 42 may be a consequence of the different growth rates during the epitaxial deposition process inherent to each crystallographic orientation plane of the material forming the epitaxial layer 40. In other embodiments, the unmerged source-drain regions 42 may have a shape other than the diamond shape depicted in FIGS. 4-5.

The terms "epitaxial growth and/or deposition" and "epitaxially formed and/or grown" mean the growth of a semiconductor material on a deposition surface of a semiconductor material, in which the semiconductor material being grown may have the same crystalline characteristics as the semiconductor material of the deposition surface. In an epitaxial deposition process, the chemical reactants provided by the source gases are controlled and the system parameters are set so that the depositing atoms arrive at the deposition surface of the substrate with sufficient energy to move around on the surface and orient themselves to the crystal arrangement of the atoms of the deposition surface. Therefore, an epitaxial semiconductor material may have the same crystalline characteristics as the deposition surface on which it may be formed. For example, an epitaxial semiconductor material deposited on a {100} crystal surface may take on a {100} orientation. In some embodiments, epitaxial growth and/or deposition processes may be selective to forming on semiconductor surfaces, and may not deposit material on dielectric surfaces, such as silicon dioxide or silicon nitride surfaces.

The epitaxial layer 40 may include any suitable semiconductor material having, for example, a {111} crystal orientation and a dopant concentration according to the characteristics of the semiconductor structure 100.

For example, in one embodiment where the semiconductor structure 100 is an n-type field effect transistor (n-FET) device, the epitaxial layer 40 may include a carbon-doped silicon (Si:C) material, where the atomic concentration of carbon (C) may range from approximately 0.2% to approximately 3.0%. The epitaxial layer 40 may be doped by any known n-type dopant use in the fabrication of n-FET devices such as, for instance, phosphorus or arsenic. In one embodiment, the dopant concentration in the epitaxial layer 40 may range from approximately $4\times10^{20}$ cm$^{-3}$ to approximately $9\times10^{20}$ cm$^{-3}$.

For example, in another embodiment where the semiconductor structure 100 is a p-type field effect transistor (p-FET) device, the epitaxial layer 40 may include a silicon germanium (SiGe) material, where the atomic concentration of germanium (Ge) may range from approximately 10% to approximately 80%. The epitaxial layer 40 may be doped by any known p-type dopant use in the fabrication of p-FET devices such as, for instance, boron. In one embodiment, the dopant concentration in the epitaxial layer 40 may range from approximately $4\times10^{20}$ cm$^{-3}$ to approximately $9\times10^{20}$ cm$^{-3}$.

Examples of various epitaxial growth process apparatuses that may be suitable for use in forming the epitaxial layers 40 may include, for example, rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE).

Figure 6:
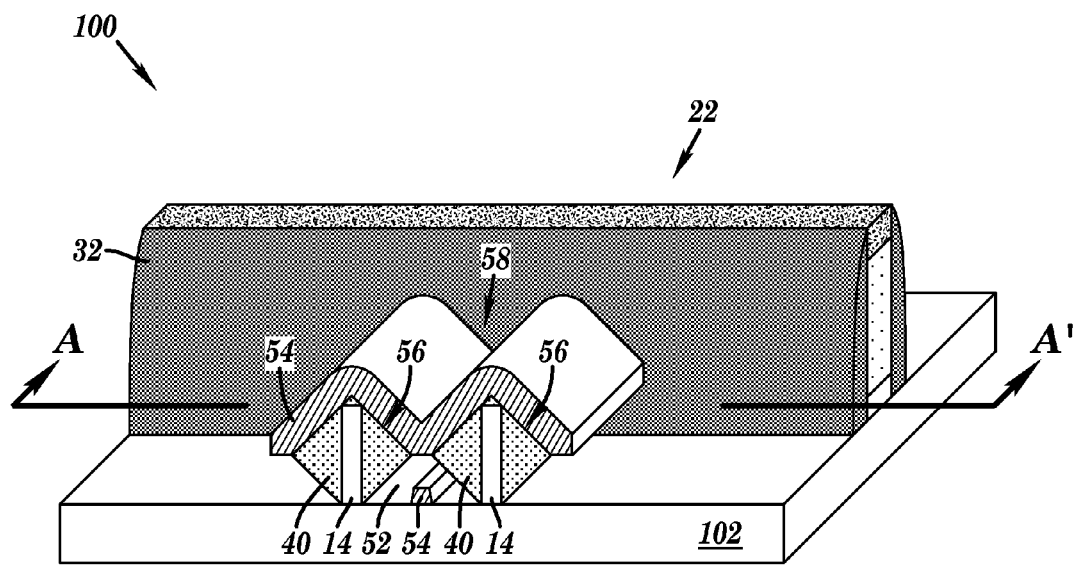
FIG. 6 is an isometric view of the semiconductor structure depicting forming a first metal layer, according to an embodiment of the present disclosure.
Figure 7:
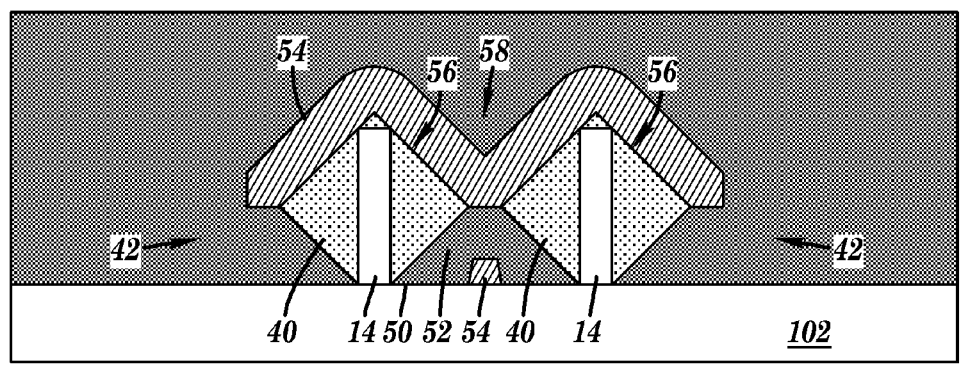
FIG. 7 is a cross-sectional view of the semiconductor structure, according to FIG. 6.

Referring now to FIGS. 6-7, a first metal layer 54 may be formed above the unmerged source-drain regions 42 as illustrated. In this embodiment, FIG. 7 is a cross-sectional view of FIG. 6 taken along line A-A'. The first metal layer 54 may be above and in direct contact with a top portion 56 of the unmerged source-drain regions 42. The formation of the first metal layer 54 may include depositing any material known in the art that may promote silicide formation, such as, for example, titanium (Ti) or tantalum (Ta). In the depicted embodiment, the first metal layer 54 includes Ti. The deposition of the first metal layer 54 may combine the unmerged source-drain regions 42 creating a merged structure 58 (hereinafter "merged source-drain region") in the semiconductor structure 100. In an exemplary embodiment, the first metal layer 54 may be formed by any deposition technique known in the art including, but not limited to, ALD. The first metal layer 54 may have a thickness ranging from approximately 2 nm to approximately 20 nm.

It should be noted that during the deposition process, a small amount of the material of the first metal layer 54 may be deposited in direct contact with a portion of the substrate 102 located between the unmerged source-drain regions 42. This may typically occur before the first metal layer 54 above the top portion 56 of the unmerged source-drain regions 42 closes the gap 44 (FIGS. 4-5) between the unmerged source-drain regions 42. In embodiments in which the first metal layer 54 may form on the surface 50 (FIG. 7) of the substrate 102, it may have a thickness of approximately 2 nm to approximately 10 nm.

It may be understood by a person skilled in the art that owing to the non-conformal nature of the conducted deposition process, the first metal layer 54 may also be deposited on exposed areas of the substrate 102. However, the first metal layer 54 deposited on exposed areas of the substrate 102 will be removed during subsequent processing steps and is therefore omitted from the figures.

Once the deposition process has been completed, a continuous first metal layer 54 may extend along the top portions 56 of the unmerged source-drain regions 42 substantially closing the gap 44 (FIGS. 4-5). The small amount of the material of the first metal layer 54 deposited on the substrate 102 between the unmerged source-drain regions 42 may be a consequence of the conducted deposition process and may represent a distinctive feature of the semiconductor structure 100. A space 52 may remain after deposition of the first metal layer 54. More specifically, the space 52 may exist below the first metal layer 54 extending above the unmerged source-drain regions 42, above the surface 50 of the substrate 102 and between two adjacent unmerged source-drain regions 42 as depicted in FIG. 7.

Figure 8:
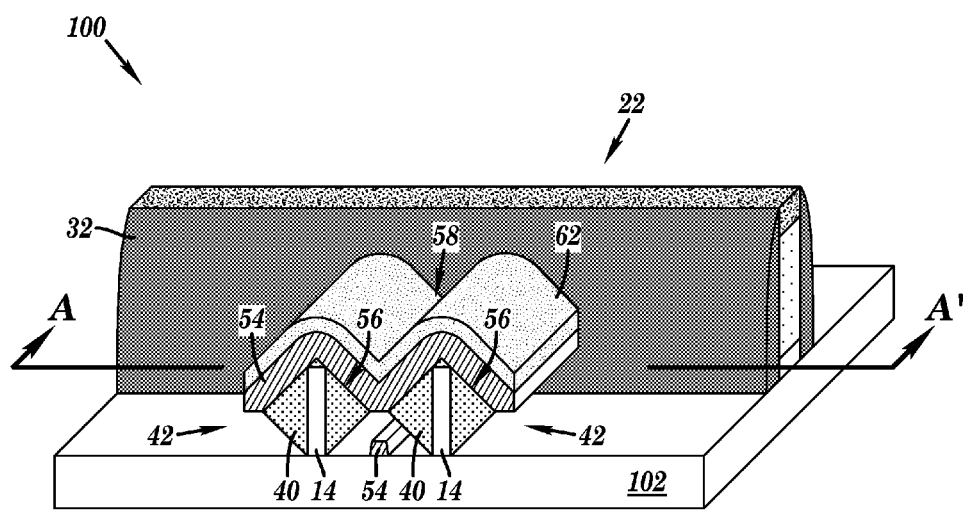
FIG. 8 is an isometric view of the semiconductor structure depicting forming a second metal layer, according to an embodiment of the present disclosure.
Figure 9:
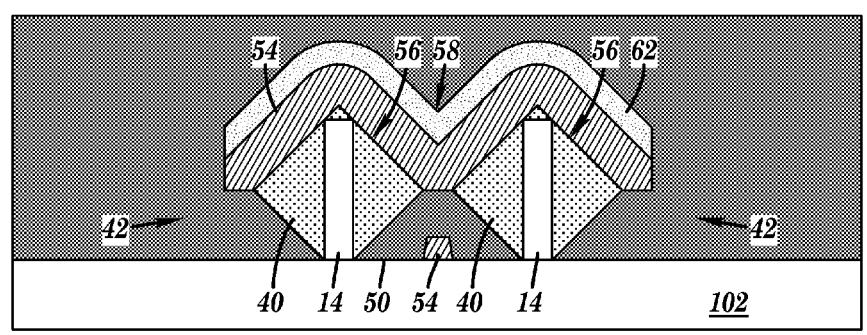
FIG. 9 is a cross-sectional view of the semiconductor structure, according to FIG. 8.

Referring now to FIGS. 8-9, a second metal layer 62 may be conformally deposited above and in direct contact with the first metal layer 54. In this embodiment, FIG. 9 is a cross-sectional view of FIG. 8 taken along line A-A'. The second metal layer 62 may protect the first metal layer 54 during a subsequent thermal annealing step. In one embodiment, the second metal layer may include titanium nitride (TiN). The second metal layer 62 may be formed by means of any deposition technique known in the art, such as, for example, CVD, ALD or PVD. The second metal layer 62 may have a thickness ranging from approximately 1 nm to approximately 10 nm.

It may be understood by a person skilled in the art that owing to the conformal nature of the conducted deposition process, the second metal layer 54 may be formed in other areas of the semiconductor structure 100. For illustration purposes only, without intent of limitation, the second metal layer 54 is shown only above the unmerged source-drain regions 42. After an annealing step, the unreacted second metal layer 54 may be substantially removed from the semiconductor structure 100 as will be described in the detail below.

Figure 10:
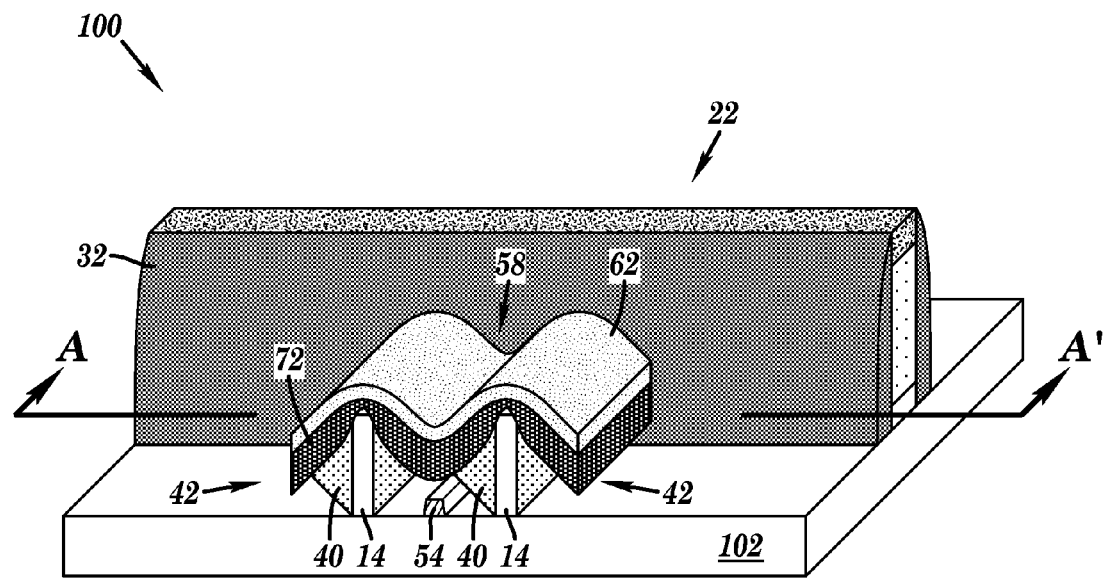
FIG. 10 is an isometric view of the semiconductor structure depicting conducting a thermal treatment to form a silicide layer, according to an embodiment of the present disclosure.
Figure 11:
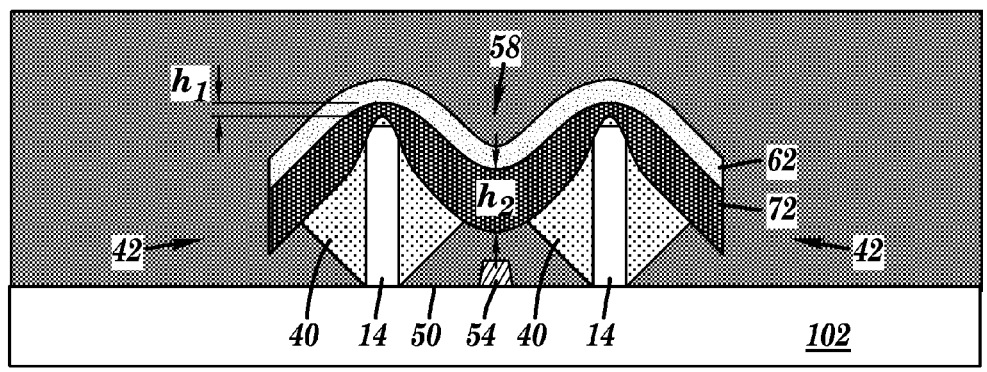
FIG. 11 is a cross-sectional view of the semiconductor structure, according to FIG. 10.

Referring now to FIGS. 10-11, a high temperature anneal process may be conducted on the semiconductor structure 100, according to an embodiment of the present disclosure. In this embodiment, FIG. 11 is a cross-sectional view of FIG. 10 taken along line A-A'. The high annealing temperatures may promote diffusion of silicon atoms from the epitaxial layer 40 into the first metal layer 54 (FIGS. 8-9) located above the unmerged source-drain regions 42. As silicon atoms migrate from the epitaxial layer 40, the high annealing temperatures may also cause titanium atoms to move inducing a chemical reaction in the first metal layer 54 (FIGS. 8-9) by which silicide growth may occur until consuming the first metal layer 54 above the unmerged source-drain regions 42, forming a silicide layer 72. During the silicidation process, growth of the silicide layer 72 may occur in a way such that two grains or silicidation fronts may be formed and merged on a grain boundary that may be positioned on approximately a central area of the silicide layer 72 between two adjacent unmerged source-drain regions 42.

More specifically, the high temperature anneal process may encourage lateral diffusion rather than vertical diffusion of the silicon atoms from the epitaxial layer 40 into the first metal layer 54 (FIGS. 8-9). This may promote the formation of a silicide layer 72 with a non-uniform thickness that may combine the unmerged source-drain regions 42, unlike typical silicidation processes where a silicide layer may be formed with a substantially uniform thickness. In this embodiment, the silicide layer 72 may exhibit an uneven thickness, being thinner towards the top portion 56 (FIGS. 6-7) of the unmerged source-drain regions 42 and substantially thicker in areas between the unmerged source-drain regions 42. The thinner areas of the silicide layer 72 may be positioned directly above the top portion 56 (FIGS. 6-7) of the unmerged source-drain regions 42, this may provide a structure having a more uniform and broader upper surface which may facilitate contact landing on the merged source-drain region 58 and may reduce the need for additional planarization treatments prior to contact formation.

In a preferred embodiment, the high temperature anneal process may include a laser-based anneal such as, for example, a millisecond annealing with temperatures varying from approximately 800° C. to approximately 1,200° C. In one embodiment, heating of the first metal layer 54 (FIGS. 8-9) may be performed at 1,100° C.

By performing the laser-based anneal, the silicidation mechanism may be changed causing the silicide layer 72 to extend in a substantial non-uniform or uneven fashion above and in direct contact with top portions of the unmerged source-drain regions 42. Additionally, most of the silicide formation may occur between the unmerged source-drain regions 42 creating the merged source-drain region 58. It should be understood that a limited amount of the silicide layer 72 may be formed above the unmerged-source drain regions 42. The millisecond laser anneal may promote the formation of the non-uniform silicide layer 72 mainly because the substantially shorter annealing times may allow achieving higher temperatures within the range of approximately 800° C. to approximately 1,200° C. for the formation of the silicide layer 72. This may promote movement of both silicon and titanium atoms during the silicidation reaction.

During traditional silicidation processes using rapid thermal annealing (RTA) and furnace, temperatures may be substantially lower varying from approximately 400° C. to approximately 700° C. It may be understood by a person skilled in the art that formation of the silicide layer 72 in this instance may take place on a conformal fashion in which the silicide layer 72 substantially surrounds the epitaxial layer 40 without combining the unmerged source-drain regions 42. In this temperature range, the diffusion specie may include silicon while titanium atoms may not move.

In one exemplary embodiment, the silicide layer 72 may have a thickness $h_1$ ranging from approximately 2 nm to approximately 20 nm above the top portion 56 (FIGS. 6-7) of the unmerged source-drain regions 42 and a thickness $h_2$ ranging from approximately 5 nm to approximately 40 nm in the areas between the unmerged source-drain regions 42.

It should be noted that the original {111} crystal orientation of the unmerged-source drain regions 42 is not altered during the silicidation process which may be an indication of a low-energy {111} plane controlling the silicidation reaction. Therefore, the silicide layer 72 may exhibit substantially the same or similar crystalline characteristics as the epitaxial layer 40 and consequently, the same as the fins 14. It should also be noted that in typical anneal processes, the original crystal orientation may be lost.

Figure 12:
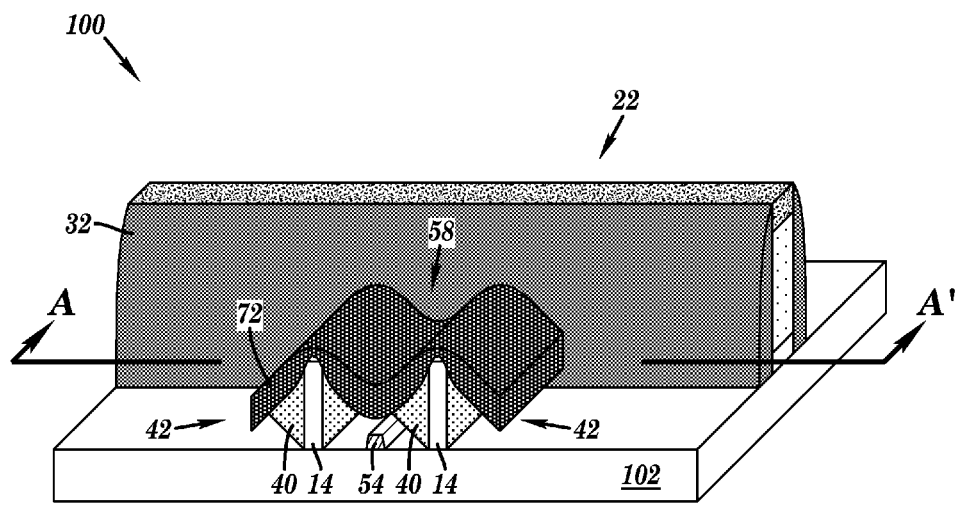
FIG. 12 is an isometric view of the semiconductor structure depicting removing the second metal layer, according to an embodiment of the present disclosure.
Figure 13:
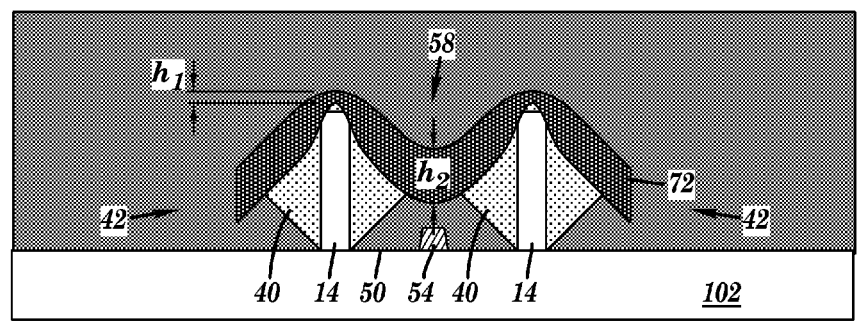
FIG. 13 is a cross-sectional view of the semiconductor structure, according to FIG. 12.

Referring now to FIGS. 12-13, the unreacted second metal layer 62 (FIGS. 10-11) may be removed from the semiconductor structure 100, according to an embodiment of the present disclosure. In this embodiment, FIG. 13 is a cross-sectional view of FIG. 12 taken along line A-A'. The second metal layer 62 (FIGS. 10-11) may be selectively removed by means of any etching technique known in the art. For example, in an embodiment in which the second metal layer 62 (FIGS. 10-11) includes titanium nitride and the silicide layer 72 includes titanium silicide, a chemical etching using a sulfuric peroxide mixture may be conducted to remove the second metal layer 62 from the semiconductor structure 100. It should be noted that during this processing step, unreacted portions of the first metal layer 54 that may be located above the substrate 102 may also be removed. It should also be noted that the small amount of the first metal layer 54 deposited between the unmerged source-drain regions 42 may remain in the semiconductor structure 100.

Therefore, by forming a first metal layer 54 above the unmerged source-drain regions 42 and conducting a high-temperature laser-based anneal process, a highly conductive silicide layer 72 may be formed to combine unmerged source-drain regions 42 without selectivity loss. The highly conductive silicide layer 72 may exhibit an uneven thickness that may provide a more uniform and broader area on a top of the merged source-drain regions that may be favorable for contact landing. As a result, source-drain parasitic resistance may be reduced as well as the need for supplemental planarization processes prior to contact formation.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A method comprising:
   conducting a laser-based anneal treatment on a metal layer positioned above and in direct contact with a first diamond shaped epitaxial layer surrounding a first fin and a second diamond shaped epitaxial layer surrounding a second fin, the metal layer extending from the first diamond shaped epitaxial layer to the second diamond shaped epitaxial layer, the laser-based anneal treatment forming a silicide layer from the metal layer and the first and second diamond shaped epitaxial layers thereby merging the first diamond shaped epitaxial layer and the second diamond shaped epitaxial layer, a portion of the silicide layer between the first and the second diamond shaped epitaxial layers being substantially thicker than a portion of the silicide layer in contact with the first and the second diamond shaped epitaxial layers,
   wherein the silicide layer has a crystal orientation of the first and the second epitaxial layers.

2. The method of claim 1, wherein conducting the laser-based anneal treatment on the metal layer comprises:
   performing a millisecond anneal.

3. The method of claim 1, wherein conducting the laser-based anneal treatment on the metal layer comprises:
   heating the metal layer to a temperature ranging between 800° C. and 1,200° C.

4. The method of claim 1, wherein the metal layer comprises titanium or tantalum.

5. The method of claim 1, further comprising:
   forming a titanium nitride layer above the metal layer to protect the metal layer during the laser-based anneal treatment; and
   removing the titanium nitride layer.

6. A method comprising:
   forming a first fin and a second fin on a substrate, the first fin being adjacent to the second fin;
   forming a gate structure over a first portion of both the first fin and the second fin, the gate structure not covering a second portion of both the first fin and the second fin;
   forming a first epitaxial layer surrounding the second portion of the first fin and a second epitaxial layer surrounding the second portion of the second fin, wherein a gap exists between the first epitaxial layer and the second epitaxial layer such that the first epitaxial layer and the second epitaxial layer are unmerged, and wherein the first epitaxial layer and the second epitaxial layer include silicon;
   depositing a first metal layer above and in direct contact with a top portion of the first epitaxial layer and a top portion of the second epitaxial layer until the gap between the first epitaxial layer and the second epitaxial layer is closed, wherein the first metal layer extends from the first epitaxial layer to the second epitaxial layer, and wherein a space remains below the first metal layer between the first epitaxial layer and the second epitaxial layer;
   depositing a second metal layer above and in direct contact with the first metal layer;
   conducting a laser-based anneal treatment on the first metal layer to promote a reaction between the first and the second epitaxial layers and the first metal layer to form a continuous silicide layer that merges the first epitaxial layer and the second epitaxial layer, wherein a portion of the continuous silicide layer between the first epitaxial layer and the second epitaxial layer is substantially thicker than a portion of the continuous silicide layer in contact with the first epitaxial layer and the second epitaxial layer; and removing the second metal layer from above the silicide layer.

7. The method of claim 6, wherein the first epitaxial layer and the second epitaxial layer each comprise diamond shaped epitaxial layers having a {111} crystal orientation.

8. The method of claim 7, wherein the continuous silicide layer takes on the {111} crystal orientation of the first epitaxial layer and the second epitaxial layer.

9. The method of claim 6, wherein depositing the first metal layer comprises:
depositing a small amount of a material of the first metal layer in direct contact with a portion of the substrate located between the first epitaxial layer and the second epitaxial layer.

10. The method of claim 6, wherein conducting the laser-based anneal treatment comprises:
heating the first metal layer to a temperature ranging between 800° C. to 1,200° C.

11. The method of claim 6, wherein conducting the laser-based anneal treatment on the first metal layer comprises:
inducing silicon atoms to diffuse from the first epitaxial layer and second epitaxial layer into the first metal layer and encourage a chemical reaction between the silicon atoms and metal atoms of the first metal layer to promote the growth of the continuous silicide layer.

12. The method of claim 6, wherein the laser-based anneal treatment comprises a millisecond anneal.

13. The method of claim 6, wherein the first metal layer comprises titanium or tantalum.

14. The method of claim 6, wherein the second metal layer comprises titanium nitride.

* * * * *